United States Patent
Bachman et al.

(10) Patent No.: US 7,221,173 B2
(45) Date of Patent: May 22, 2007

(54) METHOD AND STRUCTURES FOR TESTING A SEMICONDUCTOR WAFER PRIOR TO PERFORMING A FLIP CHIP BUMPING PROCESS

(75) Inventors: Mark Adam Bachman, Sinking Spring, PA (US); Daniel Patrick Chesire, Winter Garden, FL (US); Taeho Kook, Orlando, FL (US); Sailesh M. Merchant, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/953,291

(22) Filed: Sep. 29, 2004

(65) Prior Publication Data

US 2006/0066327 A1    Mar. 30, 2006

(51) Int. Cl.
*G01R 31/02* (2006.01)
(52) U.S. Cl. .................................... 324/754
(58) Field of Classification Search ............... 324/754, 324/763, 765, 158.1, 72.5, 73.1, 760; 438/18, 438/132, FOR. 101, FOR. 142, 8; 257/48, 257/529
See application file for complete search history.

(56) References Cited

U.S. PATENT DOCUMENTS

| | | | |
|---|---|---|---|
| 5,956,567 A * | 9/1999 | Tomita | 438/18 |
| 6,359,342 B1 | 3/2002 | Yuan et al. | |
| 6,869,809 B2 * | 3/2005 | Yu et al. | 438/14 |
| 2003/0094966 A1 * | 5/2003 | Fang | 324/765 |
| 2004/0161865 A1 | 8/2004 | Yu et al. | |
| 2004/0173794 A1 | 9/2004 | Yu et al. | |

OTHER PUBLICATIONS

Lois Yong, Tu Anh Tran, Stephen Lee, Bill Williams and Jody Ross, "Novel Method of Separating Probe and Wire Bond Regions Without Increasing Die Size," 2003 Electronic Components and Technology Conference, pp. 1323-1329.

* cited by examiner

*Primary Examiner*—Ha Tran Nguyen
*Assistant Examiner*—Tung X. Nguyen

(57) ABSTRACT

An interface assembly (20) and method for testing a semiconductor wafer prior to performing a flip chip bumping process are provided. The interface assembly includes a flip chip bonding pad (24) having a region (28) for performing the bumping process. A test pad (22) is integrally constructed with the bonding pad and includes a probe region (26) for performing wafer-level testing prior to performing the bumping process. The integral construction of the bonding and testing pads avoids, for example, an introduction of propagation delays to test signals passing therethrough, thereby improving the accuracy and reliability of wafer test results.

10 Claims, 2 Drawing Sheets

METHOD AND STRUCTURES FOR TESTING A SEMICONDUCTOR WAFER PRIOR TO PERFORMING A FLIP CHIP BUMPING PROCESS

FIELD OF THE INVENTION

The present invention is generally related to semiconductor devices, and, more particularly, to structures and techniques for enabling wafer level testing prior to performing a bumping process in a flip chip assembly.

BACKGROUND OF THE INVENTION

By way of background, flip chip microelectronic assembly generally refers to a direct electrical connection of face-down (hence, "flipped") electronic components onto substrates, circuit boards, or carriers, by means of conductive bumps on the chip bond pads. By way of comparison, wire bonding technology generally uses face-up chips with a wire connection to each pad. Flip chip technology has inter alia enabled substantial input/output (I/O) connection flexibility. For example, wire bond connections are generally limited to the perimeter of the die, driving die sizes up as the number of connections increase. Flip chip connections, such as area array bumps, can use the entire area of the die, accommodating many more connections on a smaller die.

FIG. 1 is a top view schematic representation of a metal bonding pad 8 (e.g., Al or Cu bonding pad) of a semiconductor device that includes a bump region 10 over the metal bonding pad 8. FIG. 1 is provided for illustrating some of the difficulties encountered in the prior art. The bump region 10—where a bumping process is to be performed for constructing an electrically conductive bump (e.g., a solder bump) for the flip chip assembly—may be defined by a passivation opening 12 in a passivation layer that surrounds the bonding pad.

It is known that for a semiconductor device that uses flip chip technology, performing wafer-level testing through the metal bonding pad to verify circuit functionality is generally not desirable prior to performing the bumping process. For example, a test probe tip that may be placed in contact with the bonding pad may gouge the metal pad surface. The resulting surface irregularities on the bump pad can lead to difficulties in establishing and maintaining strong adhesion for one or more metal layers that may be deposited during the formation of the bump. For example, prior to bump formation, a process referred to as under bump metallization (UBM) allows the fabrication of a barrier metal to prevent interaction of the metal pad with the solder bump. The UBM structure comprises an "adhesion layer" that should adhere well to both the bond pad metal and the surrounding passivation layer in order to provide a strong, low-stress electromechanical connection. Similarly, a "diffusion barrier" layer may be deposited to limit the diffusion of solder into the underlying material.

Known attempts to address the foregoing issues have involved construction of peripheral test pads that are physically separate but electrically connected to the bonding pad by way of interconnect lines. Such structures are commonly referred to as "redistribution layers (RDL)" in the industry. It has been observed that such RDL interconnect lines can introduce undesirable propagation delays to test signals and such delays can lead to lower device speeds. In the case of copper bonding pads, the use of an aluminum-alloy RDL at the uppermost level can lead to additional costs as the fabrication of the aluminum RDL requires additional processing steps of deposition, pattern and etch. Moreover, use of aluminum RDLs may lead to lower device yield as increased processing steps increase the probability of undesirable particles, thus limiting yield.

One approach proposed for wire bond connections, and hence of little practical use for semiconductors involving flip chip connections, is described in IEEE publication titled "Electronic Components and Technology Conference", at page Nos. 1323–1329, May 2003 in paper by Lois Young et al. This approach generally requires stacking at least two physically different metal pads over one another in order to form a probe region that is separate from a wire bond region. More specifically, this proposed approach requires stacking a portion of an enlarged aluminum cap over a copper pad disposed beneath the aluminum cap. A remaining portion of the enlarged aluminum cap (e.g., where the probe region is located) is disposed over a dielectric material and this arrangement may lead to cracks in the dielectric since the probe can apply a high force over the probe region. Moreover, the specific requirement of an Al "capping pad" over a copper pad is not a mere design choice since performing wire bonding to copper is generally very difficult for a production environment involving wire bond connections. No such considerations are applicable for flip chip connections.

Another known attempt has involved probing wafers after the bumping process is performed. For different considerations, this attempt also fails to provide a fully satisfactory solution. For example, this post-bumping probing technique may lead to incremental costs since there is a possibility that the bumping process (that takes valuable time and resources) may have been performed in an already defective wafer that should have been discarded prior to continuing with any such bump fabrication processes. Moreover, one may not be able to identify mis-processing steps that can occur during the bumping process itself, unless diagnostic partitioning studies are performed on the wafer.

Accordingly, it would be desirable to provide structures and techniques for allowing a semiconductor device or wafer to be tested prior to a bumping process so that wafer level tests can be undertaken without compromising the integrity of the metal bonding pads therein and without introducing delays to signals used for test purposes.

BRIEF DESCRIPTION OF THE DRAWINGS

These and other advantages of the invention will be more apparent from the following description in view of the drawings that show.

DETAILED DESCRIPTION OF THE INVENTION

Figure 1:
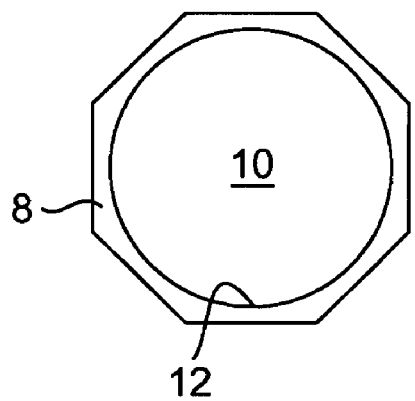
FIG. 1 is a top view schematic representation of a prior art metal flip chip bonding pad that has a common region for bumping and probing a semiconductor wafer.
Figure 2:
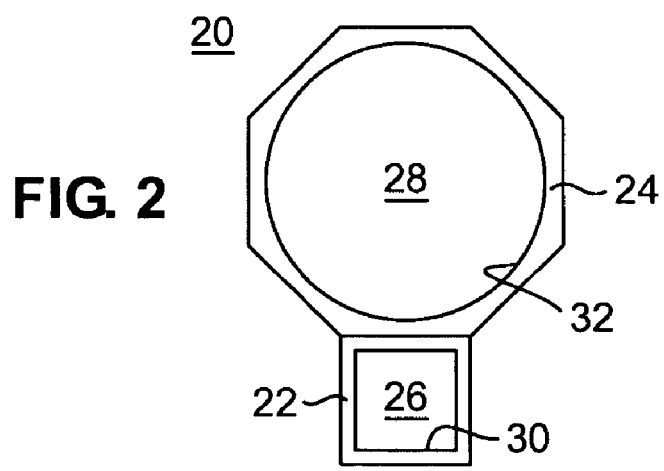
FIG. 2 is a top view of an exemplary flip chip interface assembly embodying aspects of the present invention.

FIG. 2 is a top view of an exemplary flip chip interface assembly 20 embodying aspects of the present invention.

More particularly, FIG. 2 illustrates a conductive test pad 22 integrally constructed with a conductive bonding pad 24. This arrangement provides at least the following advantages: conductive test pad 22 provides a respective probe region 26 where a probe tip may be placed for performing, for example, wafer level testing. The bonding pad 24 includes a bump region 28 that is no longer subject to mechanical contact with the probe tip and resulting surface irregularities. It is envisioned that since the test pad and bonding pad comprise an integral structure that no longer requires interconnect lines and avoids or substantially reduces propagation delays in test signals passing therethrough, an interface assembly embodying aspects of the present invention should lead to more reliable and accurate test results.

Figure 4:
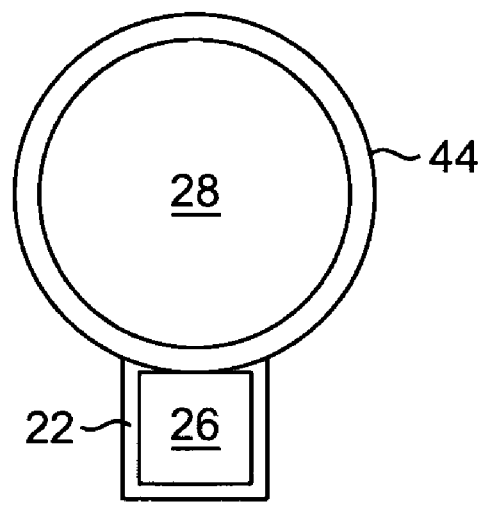

FIG. 2 further shows individual passivation openings 30 and 32 for probe region 26 and bump region 28, respectively. It will be understood that the shape of the metal bonding pad 24 is not limited to a polygonal shape being that any other geometrical shape may be used equally effective for the metal bonding pad. For example, FIG. 4 illustrates an exemplary circular shape for a metal bonding pad 44.

Figure 3:
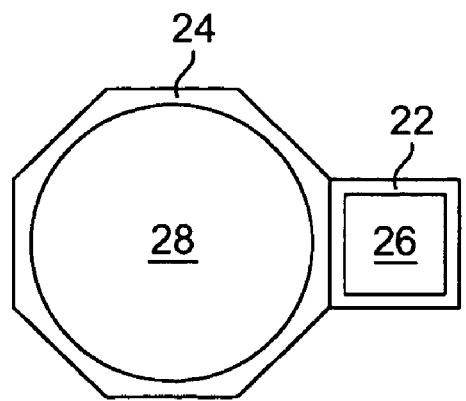
FIGS. 3 and 4 illustrate respective exemplary arrangements for the bonding pad and/or a test pad integrally constructed with the bonding pad.

Similarly, the shape of test pad 22 is not limited to a square shape since other geometrical shapes, e.g., rectangular, triangular, etc., may work equally effective. Also, the positioning of the test pad 22 relative to the bonding pad 24 is not limited to any specific orientation. For example, FIG. 2 shows an exemplary arrangement where the test pad 22 is positioned at a six o'clock position while FIG. 3 shows another exemplary arrangement where the test pad 22 is positioned at a three o'clock position. Thus, it will be appreciated that the test pad may be integrally constructed anywhere along the periphery of the bonding pad.

Figure 5:
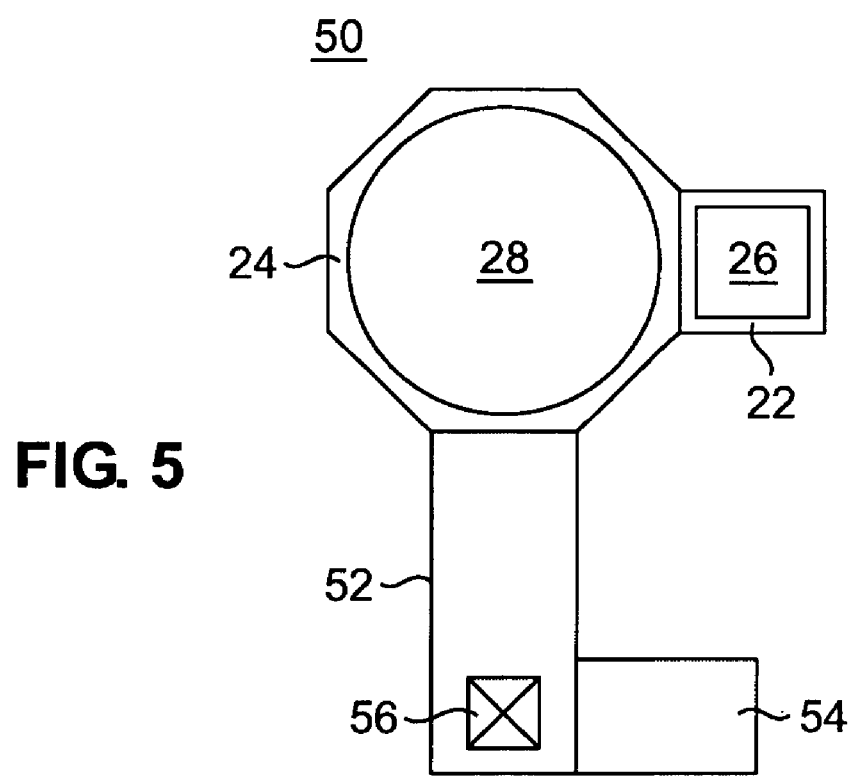
FIG. 5 illustrates an exemplary embodiment where an interface assembly embodying aspects of the present invention may be used in combination with one or more metal redistribution layers.

FIG. 5 illustrates an exemplary embodiment where an interface assembly 50 embodying aspects of the present invention may be used in combination with one or more metal redistribution layers, such as metal redistribution layers 52 and 54, for interconnecting the metal bonding pad 24 to, for example, metal runners or interconnect lines, or other pads, either directly or through vias, such as via 56. In one exemplary embodiment, metal redistribution layer 52 may be co-planar with bonding pad 24 and test pad 22, and metal redistribution layer 54, which is electrically connected to metal redistribution layer 52 by way of via 56, may be positioned at a different level relative to bonding pad 24 and test pad 22. It will be appreciated that these redistribution layers 52 and 54 may be used to connect the bonding pad to other areas of the chip, not necessarily to peripheral bond pads, as is practiced in the prior art and described earlier.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. An interface assembly for a semiconductor wafer, said interface assembly comprising:
   a flip chip bonding pad including a region for performing a bumping process; and
   a test pad integrally constructed with said bonding pad that form an integral conductive structure such that separate interconnect testing lines from said test pad to said bonding pad are not present in said integral structure, said test pad being coplanar relative to said flip chip bonding pad and including a probe region for performing wafer-level testing prior to performing said bumping process.

2. The interface assembly of claim 1 wherein said test pad may be disposed anywhere along a periphery of said bonding pad.

3. The interface assembly of claim 1 wherein said bonding pad comprises a shape selected from the group consisting of a polygonal shape, and a circular shape.

4. The interface assembly of claim 1 wherein said test pad comprises a shape selected from the group consisting of a polygonal shape, and a circular shape.

5. The interface assembly of claim 1 further comprising a first metal redistribution layer electrically connected to said bonding and test pads, and being co-planar with one another.

6. The interface assembly of claim 5 wherein said first metal redistribution layer is electrically connected by way of a via to a second redistribution layer being disposed in a different plane than the first redistribution layer.

7. The interface assembly of claim 1 wherein the region to be bumped is defined by a first opening in a passivation layer.

8. The interface assembly of claim 7 wherein the probe region is defined by a second opening in said passivation layer, said first and second openings being spaced apart from one another.

9. A method for testing a semiconductor wafer prior to performing a flip chip bumping process, said method comprising:
   providing a flip chip bonding pad having a region for performing said bumping process; integrally constructing a test pad with said bonding pad to form an integral conductive structure such that separate interconnect testing lines from said test pad to said bonding pad are not present in said integral structure; and
   disposing said test pad coplanar with said flip chip bonding pad, said test pad including a probe region for performing a wafer test prior to performing said bumping process.

10. An interface assembly for a semiconductor wafer, said interface assembly comprising:
   a flip chip bonding pad including a region for performing a bumping process;
   a test pad integrally constructed with said bonding pad, said test pad being coplanar relative to said flip chip bonding pad and including a probe region for performing wafer-level testing prior to performing said bumping process; and
   a first metal redistribution layer electrically connected to said bonding and test pads, and being co-planar with one another, said first metal redistribution layer is electrically connected by way of a via to a second redistribution layer being disposed in a different plane than the first redistribution layer.

* * * * *